(12) United States Patent
Foresta et al.

(10) Patent No.: US 9,929,659 B2
(45) Date of Patent: Mar. 27, 2018

(54) DRIVER CIRCUIT FOR SYNCHRONOUS RECTIFIER SWITCHES IN RESONANT CONVERTERS, CORRESPONDING CONVERTER AND METHOD

(71) Applicant: STMicroelectronics S.R.L., Agrate Brianza (IT)

(72) Inventors: Maurizio Foresta, Aosta (IT); Alberto Iorio, Aosta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/066,917

(22) Filed: Mar. 10, 2016

(65) Prior Publication Data

US 2017/0085188 A1     Mar. 23, 2017

(30) Foreign Application Priority Data

Sep. 23, 2015   (IT) .................. 102015000054574

(51) Int. Cl.
*H02M 3/335*     (2006.01)
*H02M 1/08*      (2006.01)
(Continued)

(52) U.S. Cl.
CPC ......... *H02M 3/33546* (2013.01); *H02M 1/08* (2013.01); *H02M 3/3378* (2013.01);
(Continued)

(58) Field of Classification Search
CPC ............... H02M 1/08; H02M 3/33546; H02M 3/33592; H02M 3/3378; H02M 2001/0058
See application file for complete search history.

(56) References Cited

U.S. PATENT DOCUMENTS

| | | | |
|---|---|---|---|
| 2009/0273951 A1 | 11/2009 | Ren et al. | |
| 2015/0370295 A1* | 12/2015 | Luo | G06F 1/26 713/330 |
| 2016/0226389 A1* | 8/2016 | Quaglino | H02M 3/33592 |

FOREIGN PATENT DOCUMENTS

CN           103683953 A          3/2014

OTHER PUBLICATIONS

Analysis of Figure of Merit—power transistor's qualitative parameter, Kozacek et al. May 2015. http://ieeexplore.ieee.org/stamp/stamp.jsp?arnumber=7161144.*

(Continued)

*Primary Examiner* — Fred E Finch, III
*Assistant Examiner* — Rafael O De Leon Domenech
(74) *Attorney, Agent, or Firm* — Seed IP Law Group LLP (57) ABSTRACT

A driver circuit for synchronous rectifier electronic switches, such as SR MOSFETs in resonant converters controls a pair of synchronous rectifier electronic switches to apply thereto a drive voltage to switch the synchronous rectifier electronic switches on and off synchronously with a converter current. The driver circuit includes a programming module to produce a first signal indicative of the figure of merit of the synchronous rectifier electronic switches, and, optionally, a current sensing module to produce a second signal indicative of the output current of the synchronous rectifier electronic switches. An output module is included to generate a value for the drive voltage which is a function of the first signal indicative of the figure of merit and, optionally, of the second signal indicative of the output current of the synchronous rectifier electronic switches.

19 Claims, 5 Drawing Sheets

(51) Int. Cl.
  *H02M 3/337* (2006.01)
  *H03K 17/06* (2006.01)
  *H02M 1/00* (2006.01)

(52) U.S. Cl.
  CPC ...... *H02M 3/33592* (2013.01); *H03K 17/063* (2013.01); *H02M 2001/0058* (2013.01); *Y02B 70/1433* (2013.01); *Y02B 70/1475* (2013.01); *Y02B 70/1491* (2013.01); *Y02P 80/112* (2015.11)

(56) References Cited

OTHER PUBLICATIONS

Pan et al., "Adaptive Hybrid Primary/Secondary-Side Digital Control for Series Resonant DC-DC Converters in 48 V VR Applications," *IEEE Journal of Emerging and Selected Topics in Power Electronics* 03(2):422-429, Jun. 2015.

Wang et al., "Research on Key Application Issues of Smart Synchronous Rectifier Driver IC in LLC Resonant Converter," IEEE Energy Conversation Congress and Exposition (ECCE), Phoenix, AZ, Sep. 17, 2011, pp. 2765-2770.

* cited by examiner

FIG. 5

DRIVER CIRCUIT FOR SYNCHRONOUS RECTIFIER SWITCHES IN RESONANT CONVERTERS, CORRESPONDING CONVERTER AND METHOD

BACKGROUND

Technical Field

The description relates generally to resonant converters.

One or more embodiments may apply to driver circuits for synchronous rectifier switches (e.g., MOSFETs) in resonant converters such as, e.g., LLC resonant converters.

Description of the Related Art

While synchronous rectifier switches are currently used in various resonant converter topologies, the need is still felt for arrangements which may improve converter efficiency by choosing a suitable synchronous rectifier drive voltage and which may be used in various applications, independently of, e.g., the associated external components and temperature.

BRIEF SUMMARY

According to one or more embodiments, a driver circuit has the features set forth in the following.

One or more embodiments may also relate to a corresponding converter and a corresponding method.

The claims are an integral part of the disclosure of embodiments as provided herein.

One or more embodiments may offer one or more of the following advantages:

increased conversion efficiency, applicability to various applications independently of external components, parasitics and temperature, and low cost, e.g., due to reduced Bill of Materials (BOM) needed.

One or more embodiments may permit implementing a synchronous rectifier driver with a programmable synchronous rectifier (SR), e.g., MOSFET gate drive voltage.

One or more embodiments may thus include a first part used to select the Figure Of Merit (FOM, e.g., $R_{DSON}*Q_{GATE}$) of a synchronous rectifier MOSFET through different programming pins in order to understand which MOS is used.

In one or more embodiments a second part may be optionally included to generate a controlled gate drive voltage proportional to the FOM and to the output current in order to improve control.

One or more embodiments may improve converter efficiency by choosing, e.g., an adequate gate drive voltage for a synchronous rectifier (SR) MOSFET.

In one or more embodiments, such a gate drive voltage may be selected, e.g., via programming pins as a function of the Figure Of Merit or FOM for the synchronous rectifier switch used.

One or more embodiments are thus eligible for various applications (independently of external components and temperature) with the drive voltage dependent on the output current in order to improve efficiency under various load conditions.

BRIEF DESCRIPTION OF THE FIGURES

One or more embodiments will now be described, by way of example only, by referring to the enclosed figures, wherein.

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Figure 1:
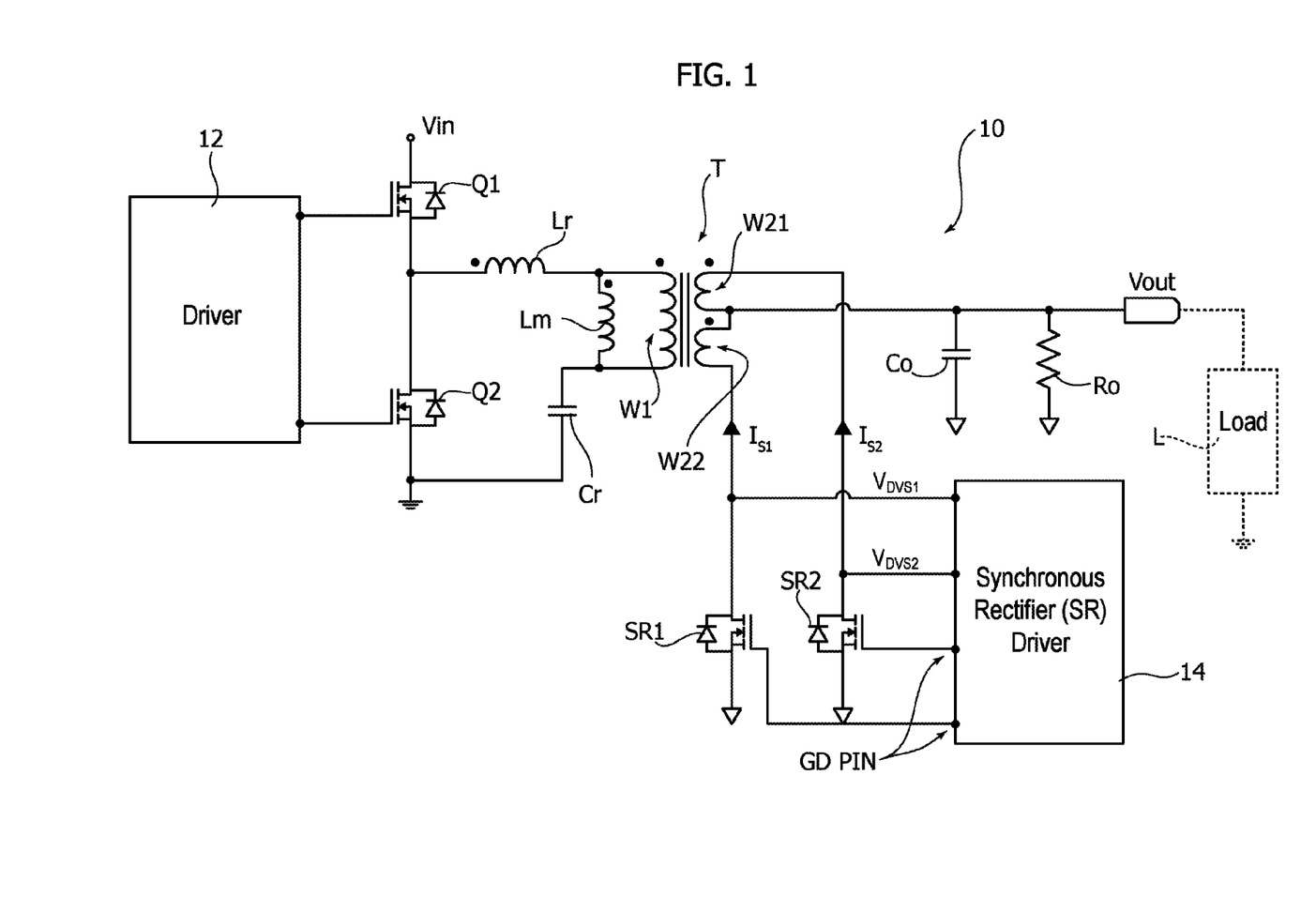
FIG. 1 is a schematic block diagram of a resonant converter.

In FIG. 1, reference 10 denotes as whole a resonant converter including a converter transformer T with a primary winding W1 and two secondary windings W21, W22 having an intermediate point therebetween to drive a converter load L (shown in dashed lines) which may be connected to an output terminal Vout.

In one or more embodiments, an RC lowpass network including a capacitor Co and a resistor Ro may be coupled to the intermediate point between the two secondary windings W21, W22, e.g., by being set between the intermediate point of the two secondary windings W21, W22 and the output terminal Vout.

In one or more embodiments, a pair of converter switches (e.g., power MOSFETs) Q1, Q2 may be provided to be switched on and off alternatively (e.g., Q2 "off" when Q1 "on" and Q1 "off" when Q2 "on") under the control of a driver 12 such as e.g., a half-bridge driver.

In one or more embodiments, the converter switches Q1, Q2 may have an intermediate point therebetween to drive the primary winding W1 of the converter transformer T.

In one or more embodiments, a pair of synchronous rectifier electronic switches SR1, SR2 (e.g., MOSFETs) may be provided each one coupled to a respective one of the secondary windings W21, W22 of the transformer T to replace a standard rectifier in order to improve the converter efficiency.

Operation of the synchronous rectifier electronic switches SR1, SR2 may be controlled by a synchronous rectifier driver 14.

In operation, when the current through either of the windings W21, W22 starts flowing into the MOSFET body diode of SR1 or SR2, the controller driver 14 detects the conductive state of the diode and switches on (that is renders conductive) the MOSFET SR1 or SR2.

When the controller driver 14 detects that the current is approaching zero, it switches off (that is renders non-conductive) the MOSFET SR1 or SR2.

In the exemplary case of FIG. 1, the resonant converter 10 is an LLC resonant converter including series Lr and parallel Lm inductances as well as a series capacitor Cr coupled to the primary winding W1 of the converter transformer T.

The basic operating principles of such a converter as exemplified in FIG. 1 are otherwise known, thus making it unnecessary to provide a more detailed description herein.

It will be otherwise appreciated that an LLC resonant converter is considered herein by way of example only. One or more embodiments may apply in general to various other resonant converter topologies providing for the presence of synchronous rectifier (SR) switches to control current flow at the secondary side of a converter transformer.

Also, while MOSFETs will be considered herein as exemplary of such synchronous rectifier electronic switches SR1, SR2, one or more embodiments may apply generally to synchronous rectifier switches (SR switches) for which a "Figure Of Merit" or FOM may be defined as a product $R_{DSON}*Q_{GATE}$, where $R_{DSON}$ denotes the "on" resistance across the switch (e.g., drain-to-source) when conductive and $Q_{GATE}$ denotes the charge at the control terminal (e.g., the gate charge). Along with MOSFETs, electronic switches such as e.g., IGBTs may be exemplary of such switches.

As indicated, in an arrangement as exemplified in FIG. 1, operation of the SR switches SR1, SR2—that is switching the synchronous rectifier electronic switches SR1, SR2 on and off synchronously with a converter current—may involve, e.g., SR MOSFET turn-on after body diode starts conducting and turn-off when the current approaches zero.

This may in turn involve a first Phase$_{1,2}$ activated when $V_{DVS1,2}<0.7V$ ($V_{DVS1,2}$ being the voltages across the body diodes of the SR switches SR1, SR2) followed by turn-on after a fixed delay $T_{PD\_ON}$ if $V_{DVS1,2}<V_{TH\_ON}$ (with $V_{TH\_ON}$ a turn-on threshold). As a result, the drain-voltage signal may follow the diode $I_{SR}$ current $V_{DVS1,2}=-R_{DS(on)} I_{SR1,2}$ with turn-off if $V_{DVS1,2}>V_{DVS1,2\_Off}$. After SR MOSFET turn-off the body diode will conduct again with the drain-source voltage going positive (e.g., >1.4V) the other drive circuit is being "armed".

This mode of operation may correspond to a simple circuit architecture, that is to a low cost solution in terms of silicon area. The SR MOSFET gate voltage may be clamped to about 11-12V when the SR driver is supplied with a high VCC. Conduction losses due to SR MOSFET $R_{DSON}$ may then be limited, at the expense of SR MOSFET gate drive losses, especially for high frequency applications.

Also, converter efficiency may turn out to be adequate only for high loads, and may depend significantly on the FOM ($R_{DSON}*Q_{GATE}$), of the SR MOSFET used.

One or more embodiments may then rely on the principle of driving the SR MOSFET gate with an adequate drive voltage (e.g., gate drive voltage) in order to improve efficiency in all conditions. In one or more embodiments this drive voltage may be a function of the FOM of the SR switch (e.g., MOSFET) used and of the application output current.

Figure 2:
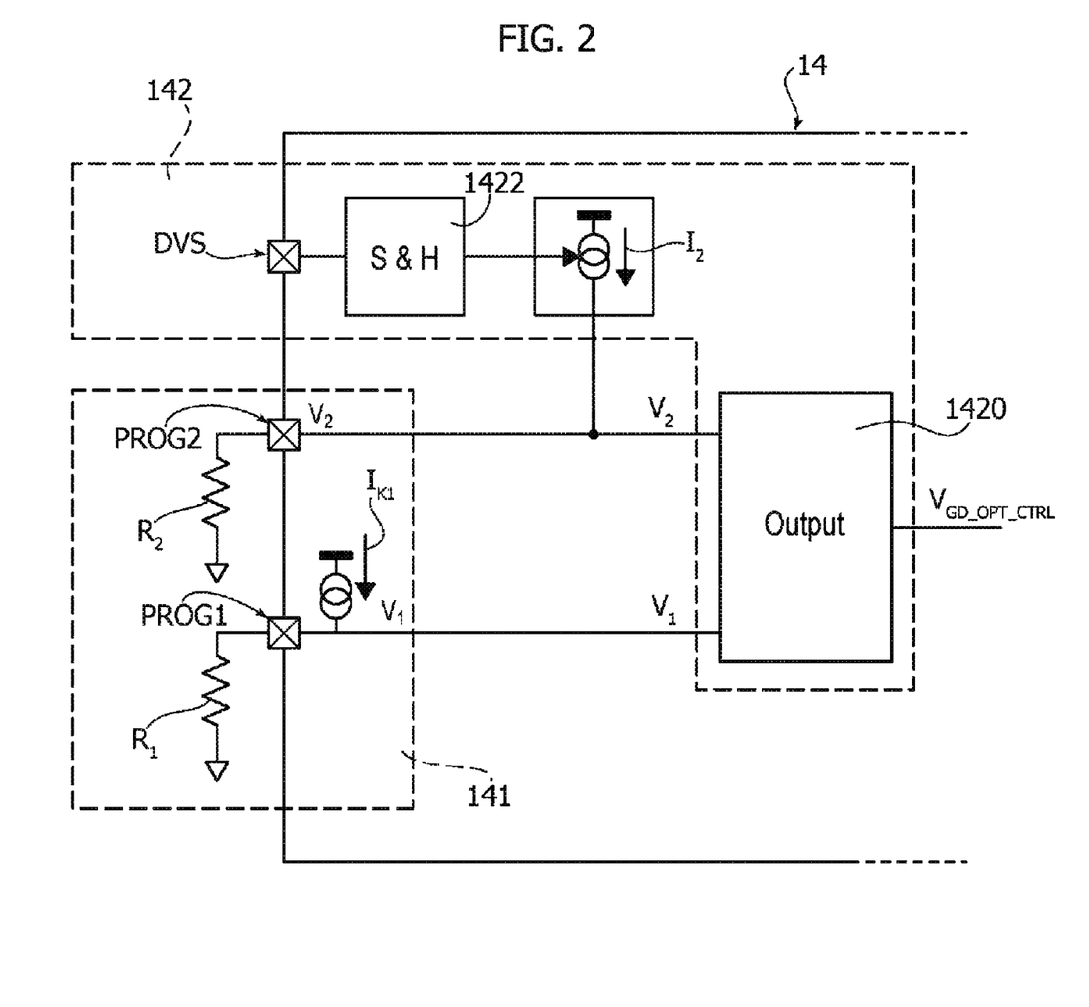
FIG. 2 is a general block diagram of one or more embodiments.

The block diagram of FIG. 2 is a schematic partial representation of a synchronous rectifier driver 14 according to one or more embodiments, intended to produce a drive voltage $V_{GD\_OPT\_CTRL}$. This drive voltage may then be applied (e.g., as exemplified in FIGS. 4 and 5 to be discussed in the following) to the control terminal (e.g., the gate) of the SR switches (e.g., MOSFETs) SR1, SR2.

While a same value for the drive voltages of both SR switches SR1, SR2 will be assumed in the following for the sake of simplicity of illustration, it will be appreciated that such a condition is not mandatory insofar as different values may be at least notionally considered.

In one or more embodiments a synchronous rectifier driver 14 as exemplified in FIG. 2 may include a first portion or section 141, which may be used to select the FOM of the SR MOSFET(s) SR1, SR2, including one or more programming pins e.g., PROG1, PROG2.

In one or more embodiments a synchronous rectifier driver 14 as exemplified in FIG. 2 may optionally include a second portion 142, which may be used to generate a controlled SR MOSFET gate drive voltage proportional to the FOM of the SR MOSFET(s) and proportional to the output current.

One or more embodiments may rely on the recognition that for an SR switch such as a MOSFET in the ohmic region the total "on" resistance $R_{DSON}$ may essentially be comprised of two terms:

a channel resistance term $R_{CH}$, which is primarily dependent on the amount of gate overdrive; and a further term $R_K$ which includes all the resistance contributions (source diffusion, accumulation, drift region, substrate, bonding wire, metallization and contact resistance for source and drain), independently of the gate voltage.

Under the (reasonable) assumption of an $R_{DSON}$ of few mΩ, the channel resistance $R_{CH}$ is essentially dictated by the overdrive ($V_{GS}-V_{TH}$).

It was further observed that:

an adequate value $V_{GD\_OPT\_CTRL}$ for the drive voltage is the one which reduces the power loss as a function of the (e.g., gate-source) voltage $V_{GS}$ across the SR MOSFET switch;

such a value is linear with the output current with a slope which is proportional to the SR switch FOM through the terms $C_{GATE}$ and β, where $C_{GATE}$ and β denote the gate capacitance and the transistor gain, respectively.

The section 141 of the synchronous rectifier driver 14 may thus be used to identify and select the FOM of the SR switches SR1, SR2.

In one or more embodiments, an external resistance $R_1$ coupled to a programming pin PROG1 in the section 141 may be used to set a voltage contribution $V_1$ of the SR MOSFET threshold (when both sections 141 and 142 are used to generate the $V_{GD\_OPT\_CTRL}$), or the desired gate voltage Drive for SR Mosfet (chosen to optimize the conversion efficiency to a given output current load) if only section 141 is used, the voltage $V_1$ may be selected equal to:

$$V_1 = R_1 \cdot I_{K1}$$

That is $R_1 = V_1/I_{K1}$ where $I_{K1}$ may be a fixed current from the SR driver 14 (e.g., 10 μA).

Similarly, section 142 of the synchronous rectifier driver 14 may be used to extract current information from a voltage pin DVS used to sense the voltages $V_{DVSi}$ (with i=1,2 for SR1 and SR2, respectively) across the body diodes of the SR switches SR1, SR2 and add this contribution (voltage $V_2$) with the contribution (voltage $V_1$) proportional to the FOM of the SR switches SR1, SR2. The sum of $V_1$ and $V_2$ may be generated in an adder or output module 1420 which produces the drive signal $V_{GC\_OPT\_CTRL}$.

In one or more embodiments, an external resistance $R_2$ coupled to a pin PROG2 may be used to set a voltage contribution $V_2$ of the SR switch due to β and $C_{GATE}$, and also proportional to $I_{OUT}$.

For instance the voltage $V_2$ may selected to be equal to:

$$V_2 = R_2 \cdot I_2 = R_2 \cdot (DVS_{AVERAGE}/R_3)$$

where $DVS_{AVERAGE}$ denotes the average value of DVS and $R_3$ denotes a constant resistance value e.g., 100 Kohm.

In order to extract current information (e.g., $I_2$) from the DVS voltage pin, the section 142 may include a sample and hold (S & H) module 1422.

Figure 3:
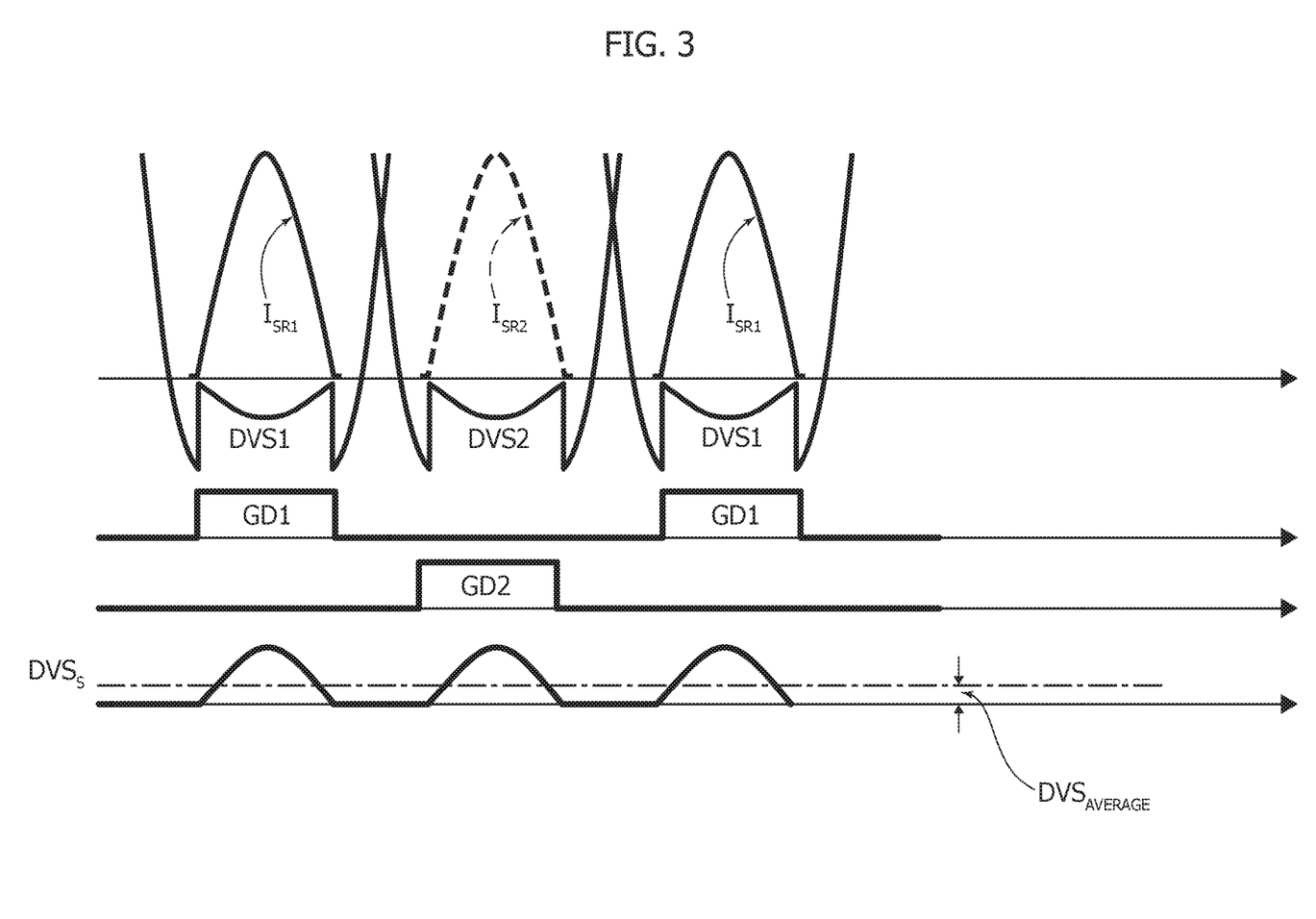
FIG. 3 is exemplary of certain signals which may occur in one or more embodiments.

In one or more embodiments, the S & H module 1422 may operate as schematically represented in FIG. 3, where:

$I_{SR1}$ and $I_{SR2}$ denote the currents traversing SR1 and SR2, respectively (with $I_{SR1}$ and $I_{SR2}$ corresponding to $I_{S1}$ and $I_{S2}$ in the general diagram of FIG. 1), and DVS1 and DVS2 denote the DVSi signals (i=1, 2 for SR1 and SR2, respectively) which may be mixed and sampled with respective control signals GD1 and GD2.

The average voltage $DVS_{AVERAGE}$ may thus be optionally detected over the pair of SR MOSFETs SR1, SR2.

The bottom diagram in FIG. 3 is representative of a possible time behavior of the DVS signals as sampled, denoted $DVS_S$, from which the average value $DVS_{AVERAGE}$ can be derived with:

$$DVS_{AVERAGE} = R_{DSON} \cdot I_{OUT}$$

$$V_2 = R_2 \cdot I_2 = R_2 \cdot (DVS_{AVERAGE}/R_3) = R_2 \cdot (R_{DSON}/R_3) \cdot I_{OUT}$$

This voltage is thus proportional to the output current and in one or more embodiments the value for the external resistance $R_2$ may be chosen e.g., as $$R_2 = \pi/4 \cdot (1/C_{GATE} \cdot V_{CC} \cdot 2 f_{SW} \cdot \beta)^{1/2} \cdot (R_3/R_{DSON})$$

where $C_{GATE}$ = gate capacitance of SR1, SR2

$V_{CC}$ = is a feed voltage for the synchronous rectifier driver (see e.g., the VCC PIN in FIG. 4 and the line VCC in FIG. 5 to be described in the following)

$f_{SW}$ = the switching frequency of the converter 10

$\beta$ = is the transistor gain ($\beta = \mu \cdot (C_{ox}/2) \cdot (W/L)$)

to produce a control (drive) voltage $V_{GD\_OPT\_CTRL}$ equal to:

$$V_{GD\_OPT\_CTRL} = V_1 + V_2 = R_1 \cdot I_{K1} + R_2 (R_{DSON}/R_3) I_{OUT}$$

or, briefly, by choosing the values for $R_1$ and $R_2$ as detailed previously:

$$V_{GD\_OPT\_CTRL} = V_{GD} = V_{TH1} + m \cdot I_{OUT}$$

where $m = R_2 (R_{DSON}/R_3)$.

Figure 4:
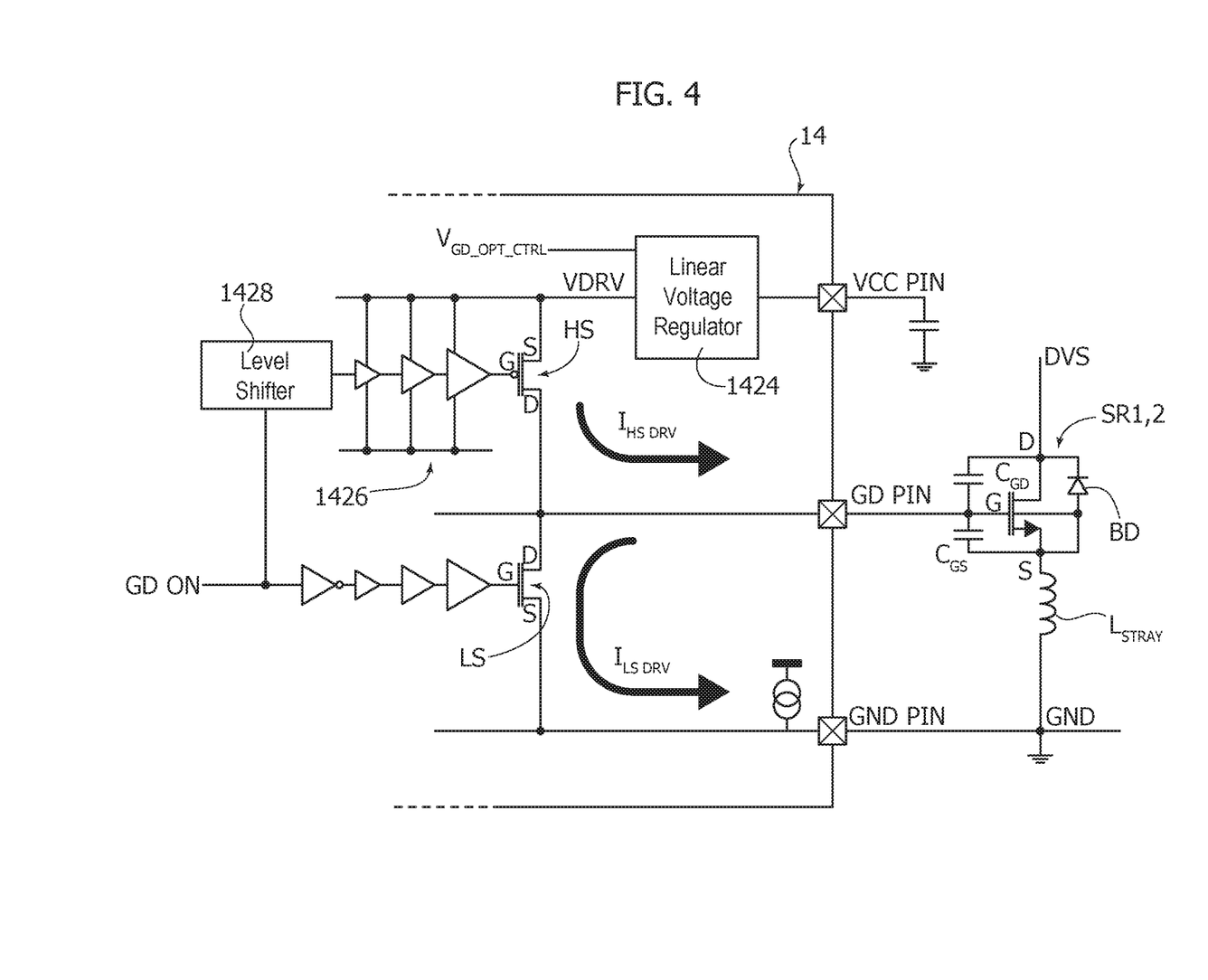
FIGS. 4 and 5 are schematic block diagrams of one or more embodiments.
Figure 5:
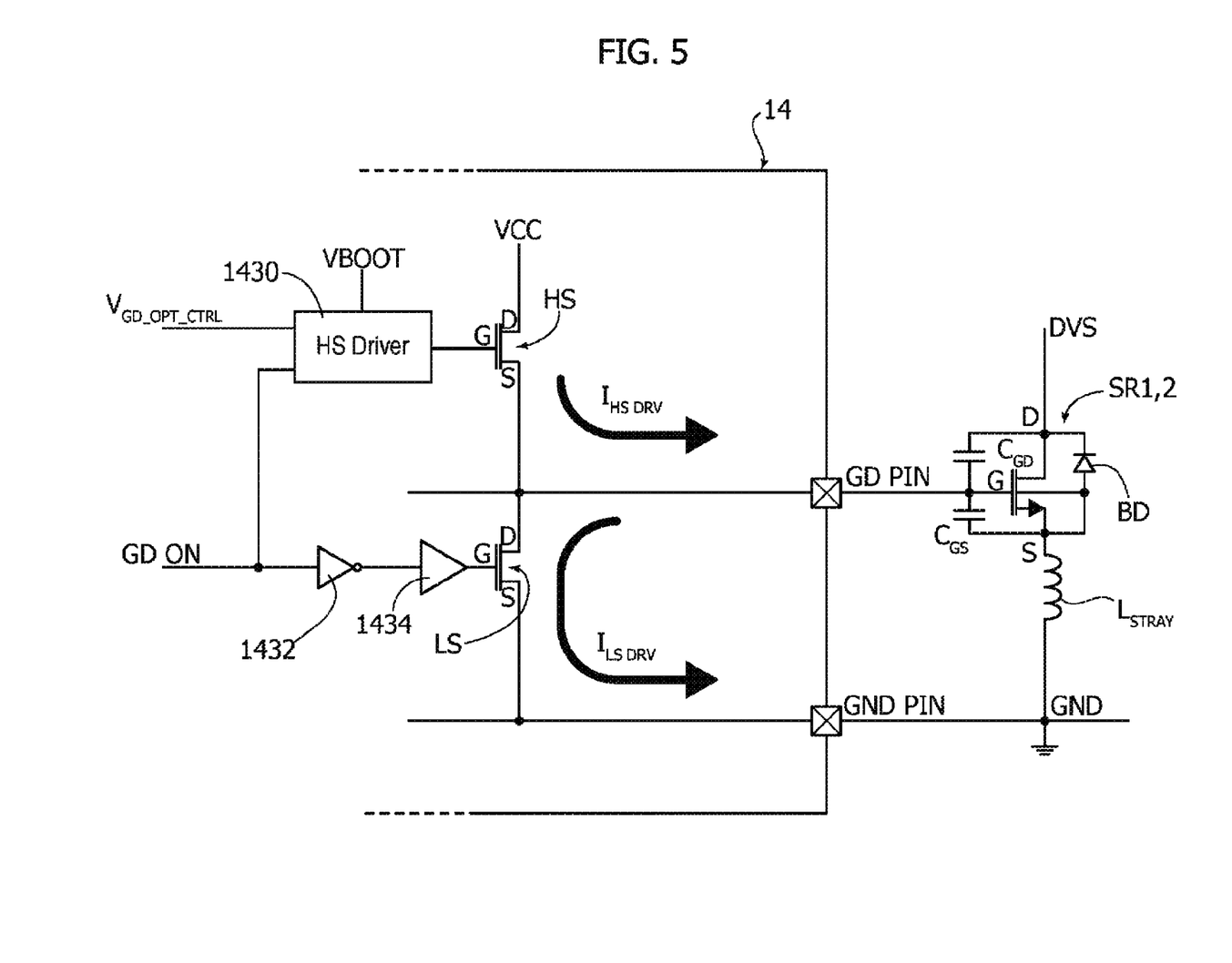

The block diagrams of FIGS. 4 and 5 are exemplary of various ways of using the voltage $V_{GD\_OPT\_CTRL}$.

FIGS. 4 and 5 refer by way of example to a synchronous rectifier driver 14 including (in a manner known per se) a high-side switch HS and a low-side switch LS to produce respective drive currents $I_{HS\_DRV}$ and $I_{LS\_DRV}$ for a SR switch SR1,2 having a control terminal (e.g., gate) connected to a gate drive pin GD PIN for each SR MOSFET SR1, SR2 (see also FIG. 1).

In one or more embodiments as exemplified in FIGS. 4 and 5 the high-side switch HS and the low-side switch LS may be MOSFETS.

In FIGS. 4 and 5, GND denotes a ground terminal (ground plane) and the representation of the SR MOSFETs SR1,2 also includes the body diode BD, as well as the gate-drain capacitance $C_{GD}$, the gate-source capacitance $C_{GS}$ and the stray inductance $L_{STRAY}$ associated with the source (parasitics).

In one or more embodiments as exemplified in FIG. 4 in the case of a P-channel driver, the voltage $V_{GD\_OPT\_CTRL}$ may be fed to a (linear) voltage regulator 1424 together with a drive signal VDRV (derived e.g., via an amplifier chain 1426 from a level shifter 1428 receiving an "ON" signal GD ON) in order to select a drive voltage for the driver stage HS, LS.

In an arrangement as exemplified in FIG. 4 the drive voltage $V_{GD\_OPT\_CTRL}$ may thus be used as a voltage reference for the LDO (low dropout) voltage regulator 1424, so that the VDRV voltage may be made equal to the drive voltage $V_{GD\_OPT\_CTRL}$.

One or more embodiments as exemplified in FIG. 5 in the case of a N-channel driver with bootstrap may provide for bootstrap operation with a high-side driver 1430 receiving a VBOOT input signal as well the GD ON signal. The GD ON signal may also be fed, after logical inversion at 1432, to a driver stage 1434 for the low-side switch LS.

In an arrangement as exemplified in FIG. 5 the high-side (HS) driver 1430 may include a controllable gate voltage clamp and the drive voltage $V_{GD\_OPT\_CTRL}$ may be used as a voltage reference for such HS driver circuit, e.g., to select a voltage clamp for the driver. This block generates a controlled gate voltage in order to clamp the GD signal to a desired drive voltage.

In the exemplary embodiments of both FIGS. 4 and 5, and in other possible embodiments as well, the signal $V_{GD\_OPT\_CTRL}$, however produced (e.g., as a function of the signal V1—alone—or as a function of both signals V1 and V2) may not be applied directly e.g., via the pin GD PIN to the drive terminals of the switches SR1, SR2, but may rather be used to control operation of the switches HS and LS which are switched on and off as a function (e.g., under the control) of the value $V_{GD\_OPT\_CTRL}$.

In one or more embodiments, the value $V_{GD\_OPT\_CTRL}$ calculated as a function of the first signal $V_1$ indicative of the figure of merit and, optionally, the second signal $V_2$ indicative of the output current $I_2$ and also of the figure of merit may not by itself represent the drive voltage to be applied to SR1, SR2. More generally, in one or more embodiments $V_{GD\_OPT\_CTRL}$ will represent a value for said drive voltage, that is a value which may be used to control the drive voltage (e.g., via the switches HS, LS, and the regulator 1424 or the HS driver 1430).

One or more embodiments as exemplified herein may thus provide a driver circuit for synchronous rectifier electronic switches in resonant converters, the driver circuit coupleable to a control terminal of a synchronous rectifier electronic switch to apply thereto a drive voltage to switch said synchronous rectifier electronic switch on and off synchronously with a converter current.

In one or more embodiments, the driver circuit 14 may include:

a programming module 141 to produce a first signal ($V_1$) indicative of the figure of merit of the synchronous rectifier electronic switch SR1, SR2, and an output module 1420 to generate a value $V_{GD\_OPT\_CTRL}$ for the drive voltage which is a function of the first signal $V_1$ indicative of the figure of merit.

In one or more embodiments, the driver circuit 14 may optionally include a current sensing module 142 to produce a second signal $V_2$ indicative of the output current $I_2$ and also of the figure of merit of the synchronous rectifier electronic switch SR1, SR2, with the output module 1420 configured for generating a value $V_{GD\_OPT\_CTRL}$ for the drive voltage which is a function both of the first signal (e.g., $V_1$) indicative of the figure of merit and of the second signal (e.g., $V_2$) indicative of the output current $I_2$ and also of the figure of merit of the synchronous rectifier electronic switch SR1, SR2.

In one or more embodiments the value $V_{GD\_OPT\_CTRL}$ for the drive voltage may thus be generated as a function of (both) the figure of merit and the output current of the synchronous rectifier electronic switch SR1, SR2.

In one or more embodiments, satisfactory operation may be achieved by generating a value $V_{GD\_OPT\_CTRL}$ for the drive voltage as a function of the figure of merit alone.

Without prejudice to the underlying principles, the details and embodiments may vary, even significantly, with respect to what has been described by way of example only without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The extent of protection is defined by the annexed claims.

The invention claimed is:

1. A driver circuit, comprising:
   a programming module configured to produce a first signal indicative of a figure of merit of a synchronous rectifier electronic switch;
   a current sensing module configured to produce a second signal indicative of an output current of the synchronous rectifier electronic switch; and
   an output module configured to generate a value for a drive voltage to be applied to the synchronous rectifier electronic switch which is a function of the first signal indicative of the figure of merit and the second signal indicative of the output current of the synchronous rectifier electronic switch.

2. The driver circuit of claim 1, wherein said output module includes an adder to generate said value as the sum of said first signal and said second signal.

3. The driver circuit of claim 2, wherein said second signal is proportional to the output current.

4. The driver circuit of claim 2, wherein said current sensing module includes an averaging circuit to sense said output current as a function of an average voltage across said synchronous rectifier electronic switch.

5. The driver circuit of claim 3, wherein the averaging circuit comprises a sample and hold circuit that detects the average voltage over a pair of synchronous rectifier electronic switches including the synchronous rectifier electronic switch.

6. The driver circuit of claim 4 further comprising a pair of driver switches alternatively switchable on and off as a function of said value for said drive voltage, said pair of driver switches having an intermediate point therebetween coupleable to a control terminal of a respective synchronous rectifier electronic switch of the pair.

7. The driver circuit of claim 5, wherein one of said driver switches is a P-channel MOSFET fed with said value for said drive voltage as a reference voltage.

8. The driver circuit of claim 6 further comprising a voltage regulator that receives said reference voltage and generates said value for said drive voltage in response to said reference voltage.

9. The driver circuit of claim 5, wherein one of said driver switches is a bootstrapped N-channel MOSFET fed with said value for said drive voltage as a gate voltage clamp.

10. A resonant converter, comprising:
    at least one synchronous rectifier electronic switch; and
    a driver circuit coupled to the synchronous rectifier electronic switch, the driver circuit including:
        a programming module that in operation produces a first signal indicative of a figure of merit of the at least one synchronous rectifier electronic switch;
        a current sensing module that in operation produces a second signal indicative of an output current through the synchronous rectifier electronic switch; and
        an output module that in operation generates a drive voltage that in operation is applied to the at least one synchronous rectifier electronic switch, the drive voltage having a value that is a function of the first signal indicative of said figure of merit and a function of the second signal indicative of the output current.

11. The resonant converter of claim 10, wherein the at least one synchronous rectifier switch comprises at least one synchronous rectifier MOSFET.

12. The resonant converter of claim 10 further comprising:
    a converter transformer with:
        a primary winding; and
        two secondary windings having an intermediate point therebetween to drive a converter load;
    a pair of converter switches alternatively switchable on and off, said pair of converter switches having an intermediate point therebetween to drive the primary winding of the converter transformer; and
    a pair of synchronous rectifier electronic switches, each coupled to a respective one of the secondary windings of said converter transformer, said synchronous rectifier electronic switches further coupled to the driver circuit.

13. The resonant converter of claim 12, wherein the resonant converter is an LLC converter including series and parallel inductances as well as a series capacitor coupled to the primary winding of the converter transformer.

14. The resonant converter of claim 13 further comprising a half-bridge driver circuit coupled to control the pair of converter switches.

15. A method of driving a synchronous rectifier electronic switch in a resonant converter, the method comprising:
    switching the synchronous rectifier electronic switch on and off synchronously with a converter current by applying a drive voltage to a control terminal of the synchronous rectifier electronic switch;
    sensing a current through the synchronous rectifier electronic switch; and
    generating a value for the drive voltage applied to the control terminal of the synchronous rectifier electronic switch, the value being a function of the sensed current through the synchronous rectifier electronic switch and a function of a figure of merit of the synchronous rectifier electronic switch.

16. The method of claim 15 further comprising generating a value for said drive voltage as a function of the figure of merit and an output current of said synchronous rectifier electronic switch.

17. The method of claim 16 further comprising:
    calculating an average value for voltages across a pair of synchronous rectifier electronic switches including said synchronous rectifier electronic switch; and
    generating a value indicative of the output current based on the average value.

18. The method of claim 16 further comprising:
    summing first and second values that are based on the figure of merit and the output current and also on the figure of merit, respectively; and generating the drive voltage based on the summed first and second values.

19. The method of claim 15, wherein the figure of merit is based on a drain-to-source resistance and a gate charge of a MOSFET transistor forming the synchronous rectifier electronic switch.

* * * * *

UNITED STATES PATENT AND TRADEMARK OFFICE
CERTIFICATE OF CORRECTION

PATENT NO. : 9,929,659 B2  
APPLICATION NO. : 15/066917  
DATED : March 27, 2018  
INVENTOR(S) : Maurizio Foresta et al.

Page 1 of 1

It is certified that error appears in the above-identified patent and that said Letters Patent is hereby corrected as shown below:

In the Claims

Column 7, Line 43:
"5. The driver circuit of claim 3, wherein the averaging" should read --5. The driver circuit of claim 4, wherein the averaging--.

Column 7, Line 48:
"6. The driver circuit of claim 4 further comprising a pair" should read --6. The driver circuit of claim 5 further comprising a pair--.

Column 7, Line 54:
"7. The driver circuit of claim 5, wherein one of said driver" should read --7. The driver circuit of claim 6, wherein one of said driver--.

Column 7, Line 57:
"8. The driver circuit of claim 6 further comprising a" should read --8. The driver circuit of claim 7 further comprising a--.

Signed and Sealed this  
Seventh Day of May, 2019

Andrei Iancu  
*Director of the United States Patent and Trademark Office*